(12) United States Patent
Bonnin et al.

(10) Patent No.: US 9,769,954 B2
(45) Date of Patent: Sep. 19, 2017

(54) LIQUID COOLING SYSTEM FOR A COMPUTER CABINET

(71) Applicant: BULL SAS, Les Clayes-Sous-Bois (FR)

(72) Inventors: Jean-Christophe Bonnin, Rambouillet (FR); Eimed Nadifi, Le Chesnay (FR)

(73) Assignee: BULL SAS, Les Clayes-Sous-Bois (FR)

( * ) Notice: Subject to any disclaimer, the term of this patent is extended or adjusted under 35 U.S.C. 154(b) by 557 days.

(21) Appl. No.: 14/186,976

(22) Filed: Feb. 21, 2014

(65) Prior Publication Data

US 2014/0238065 A1 Aug. 28, 2014

(30) Foreign Application Priority Data

Feb. 28, 2013 (FR) ...................... 13 51776

(51) Int. Cl.
| | | |
|---|---|---|
| *F25D 23/12* | (2006.01) | |
| *F28D 15/00* | (2006.01) | |
| *H05K 7/20* | (2006.01) | |

(52) U.S. Cl.
CPC ....... *H05K 7/2029* (2013.01); *H05K 7/20218* (2013.01); *H05K 7/20645* (2013.01); *H05K 7/20781* (2013.01)

(58) Field of Classification Search
CPC ............ H05K 7/2029; H05K 7/20218; H05K 7/20781; H05K 7/20709; H05K 7/20645
See application file for complete search history.

(56) References Cited

U.S. PATENT DOCUMENTS

| | | | | |
|---|---|---|---|---|
| 6,564,571 B2* | 5/2003 | Feeney | ...................... | G06F 1/20 165/80.2 |
| 6,828,675 B2* | 12/2004 | Memory | ............ | H05K 7/20681 165/104.33 |
| 7,024,573 B2* | 4/2006 | Patel | ......................... | G06F 1/20 165/144 |
| 7,184,269 B2* | 2/2007 | Campbell | ............ | H05K 7/2079 165/104.33 |
| 7,343,963 B2* | 3/2008 | Zoodsma | ........... | H05K 7/20781 165/104.33 |
| 8,369,090 B2* | 2/2013 | Chester | .............. | H05K 7/20772 165/104.33 |

(Continued)

FOREIGN PATENT DOCUMENTS

| | | |
|---|---|---|
| JP | H05-41589 | 2/1993 |
| JP | H08-219615 | 8/1996 |

OTHER PUBLICATIONS

Search Report and Written Opinion as issued for French Patent Application No. 1351776, dated Nov. 6, 2013.

*Primary Examiner* — Allen Flanigan
*Assistant Examiner* — Filip Zec
(74) *Attorney, Agent, or Firm* — Pillsbury Winthrop Shaw Pittman LLP

(57) ABSTRACT

A computer cabinet includes at least one rackable server cooled by a cooling circuit; a cooling circuit supply device including:
  two cooling modules, each cooling module including:
    a primary hydraulic circuit;
    a secondary hydraulic circuit;
    a heat exchanger;
    a pump;
    a controller to control the pump;
  a central control unit connected to the controller of each of the cooling modules;
the central control unit being capable of activating one of the cooling modules while the other cooling module is inactive.

20 Claims, 2 Drawing Sheets

(56) References Cited

U.S. PATENT DOCUMENTS

| | | | |
|---|---|---|---|
| 2011/0240281 A1* | 10/2011 | Avery | G05D 23/1917 165/287 |
| 2013/0025818 A1* | 1/2013 | Lyon | H01L 23/473 165/11.1 |
| 2013/0027884 A1* | 1/2013 | Campbell | H05K 7/2029 361/700 |
| 2014/0311169 A1* | 10/2014 | McDonnell | F25B 31/006 62/62 |

* cited by examiner

LIQUID COOLING SYSTEM FOR A COMPUTER CABINET

CROSS REFERENCES TO RELATED APPLICATIONS

This application claims priority to French Patent Application No. 1351776, filed Feb. 28, 2013, the entire content of which is incorporated herein by reference in its entirety.

FIELD

This invention relates to a liquid cooling system for a computer cabinet.

BACKGROUND

In many applications, processors with their associated electronics (for example memory, hard disks, power supplies, etc.) are contained inside computer blades that are themselves inserted in rackable servers stacked on each other in a rack or a cabinet. Initially, the electronic components on these computer blades were cooled by air moving inside parallel air circulation paths that passed between the computer blades using fan type air circulation means. However, air cooling is not sufficient in "server farm" type installations in which a large number of computer cabinets are placed in a small space.

Therefore, liquid cooling systems have been developed. These cooling systems generally comprise essentially:
- hydraulic circuits filled with a coolant that passes through the computer cabinets;
- a device for circulating the coolant inside the hydraulic circuits; and
- cooling device to cool the coolant.

In general, the coolant circulation device and the cooling device are not contained in the computer cabinets because the risk of a coolant leak is very high, particularly due to the fact that the quality of this coolant is not controlled, and the risk of the hydraulic circuits becoming clogged is very high because the diameter of the channels that pass through the computer cabinets is small.

Furthermore, existing cooling systems are very large and in particular this creates a problem of size in computer rooms containing these cabinets, because these computer rooms should contain not only the computer cabinets but also their cooling systems.

Furthermore, cooling systems according to prior art are shut down in the case of a failure or a leak, consequently the corresponding computer cabinets are also shut down.

SUMMARY

An aspect of the invention is aimed at correcting the disadvantages of the state of the art by disclosing a liquid cooling system for a computer cabinet that can function even in the case of a failure or a leak and that does not occupy space in the computer room in which the computer cabinet is located.

To that purpose, a first aspect of the invention concerns a computer cabinet comprising:
- at least one rackable server through which a cooling circuit passes, the cooling circuit carrying a coolant, the cooling circuit of the cabinet comprising an inlet and an outlet;
- a coolant supply device configured to supply the cooling circuit with coolant, the supply device comprising:
  - two cooling modules, each cooling module comprising:
    - a primary hydraulic circuit comprising an outlet able to be connected to the inlet of a client hydraulic network and an inlet able to be connected to the outlet of the client hydraulic network;
    - a secondary hydraulic circuit comprising an outlet connected to the inlet of the cooling circuit of the computer cabinet and an inlet connected to the outlet of the cooling circuit of the computer cabinet;
    - a heat exchanger configured to cool the coolant passing through the secondary hydraulic circuit by heat dissipation through the primary hydraulic circuit;
    - a pump capable of controlling the coolant flow in the secondary hydraulic circuit;
    - a controller capable of controlling the pump;
  - a central control unit connected to the controller of each of the cooling modules;
  the central control unit being capable of activating one of the cooling modules while the other cooling module is inactive, the secondary hydraulic circuit of the active cooling module supplying the cooling circuit so as to keep the coolant at a constant differential pressure between the inlet and the outlet of the cooling module.

The cooling modules can thus maintain a constant coolant flow to each of the computer blades contained in the rackable servers in the computer cabinet.

In this document, the term "primary" hydraulic circuit is used to refer to circuits connected to the hydraulic network of the client infrastructure, and the term "secondary" hydraulic circuit is used to refer to hydraulic circuits connected to the computer cabinet cooling circuit.

Thus, the cabinet cooling system according to an embodiment of the invention comprises two completely identical cooling modules; one of the cooling modules is active while the other cooling module is inactive. Thus, if one of the two cooling modules has a malfunction, the central control unit can activate the other cooling module such that the computer cabinet is still cooled by at least one cooling module. Thus, the computer cabinet can continue to function even following a failure or during maintenance of one of the cooling modules. The cooling modules can be removed for maintenance without stopping cooling the servers.

The cooling modules can control the coolant flow to maintain a constant coolant flow to the servers regardless of the number of these servers in the cabinet, and can control the temperature to maintain a constant temperature at the server inlets regardless of their heat dissipation. The cooling modules are also capable of detecting failures by monitoring pressure and temperature sensors using controller specific to each cooling module. Furthermore, the fact that constant velocities are maintained in the cooling circuit and in the secondary hydraulic circuit connected to it, can prevent circuit vibrations. Hydraulic objects in the cooling module are optimised firstly in terms of consumption of pressure losses so as to minimise the hydraulic energy to be output by the pump and thus to optimise its size and electricity consumption, and secondly in terms of dimensions in order to make the module as compact as possible. The cooling device according to an embodiment of the invention can dissipate 80 kW.

The computer cabinet according to an embodiment of the invention can also comprise one or several of the following characteristics individually or in any technically possible combination.

Beneficially, the inlet and the outlet of the primary hydraulic circuit of each cooling module are fitted with non-drip quick couplings making it easy to connect and disconnect the primary hydraulic circuit to and from the client hydraulic network.

Beneficially, the inlet and the outlet of the secondary hydraulic circuit of each cooling module are fitted with non-drip quick couplings that can be used to easily connect and disconnect the secondary hydraulic circuit to and from the cooling circuit.

Beneficially, the hydraulic circuits of the cooling modules are connected in parallel.

According to an embodiment, the two cooling modules are located in a lower part of the cabinet, the rackable server being located in an upper part. In this document, the term "lower part" is used to denote a part that is located under another part of the cabinet that is denoted by the term "upper part" when the cabinet is in operation. The fact that cooling modules are under the rackable server means that if there is a leak of coolant in one of the cooling modules, this coolant will not run on the rackable server.

The static pressure of the coolant in the cooling circuit is greater than or equal to 2 bars. The fact that the coolant is kept under pressure protects the pump against any risk of cavitation, and allows the computer cabinet cooling system to function even if there is a leak.

According to an embodiment, each cooling module also comprises at least one temperature sensor capable of measuring the temperature at the outlet from the secondary hydraulic circuit of the cooling module, the coolant flow in the primary hydraulic circuit being maintained at a flow chosen such that the temperature at the outlet from the secondary hydraulic circuit is equal to a threshold temperature. This thus assures that the temperature at the inlet to the cooling circuit that passes through the rackable server is constant and therefore cooling of electronic components in computer blades contained in the rackable servers is optimum.

In an embodiment, each cooling module comprises three temperature sensors located in the same location, so that the measurements made by each of the three temperature sensors can be checked.

Beneficially, each cooling module also comprises a bypass channel arranged to allow the coolant to bypass the pump. This bypass channel makes it possible to test the pump in each of the cooling modules without needing to connect the cooling module to a cooling circuit. Furthermore, this bypass channel can be used to choose the coolant quantity injected at the outlet from the cooling module. The bypass channel may be provided with a control valve for this purpose controlled by the controller of the cooling module, the control valve being capable of controlling the fluid quantity that is carried by the bypass channel. The fact that the quantity of fluid that passes through the pump is dosed improves the linearity of the flow response.

Beneficially, the secondary hydraulic circuit of each cooling module comprises a non-return valve on the upstream side of the exchanger. The term "upstream" is used with reference to the coolant circulation direction in the secondary hydraulic circuit. The non-return valve in each of the two cooling modules protects each of them from recirculation of coolant from the active cooling module through the inactive cooling module.

According to an embodiment, each cooling module comprises at least one first pressure sensor, the controller of each cooling module being connected to the first two pressure sensors of each of the two cooling modules. The fact that the controller of each cooling module are connected to two pressure sensors located in different cooling modules simulates redundancy of pressure measurements without having redundant pressure sensors within a single cooling module.

The first pressure sensor ($P_{0-1}$) in each cooling module may be located at the inlet to the pump of said pressure module.

In an embodiment, each cooling module also comprises a second pressure sensor ($P_{1-1}$) located at the output from the cooling module. The active cooling module can thus be controlled such that the flow provided to each computer blade is constant by controlling the control valve such that the pressure difference between the cooling module outlet and inlet is constant and equal to a differential threshold pressure.

In an embodiment, each cooling module also comprises a third pressure sensor ($P_{2-1}$) at the outlet from the pump of the cooling module. This third pressure sensor verifies that the pump functions correctly in the case of an active module, and it can verify the pressure measurement in the case of an inactive module by comparing this pressure with the pressure $P_{0-2}$ of the other active module.

BRIEF DESCRIPTION OF THE FIGURES

Other characteristics and benefits of the invention will become clear after reading the following detailed description with reference to the appended figures that illustrate.

Identical or similar elements are identified by the same reference marks on all figures, to facilitate understanding.

DETAILED DESCRIPTION

Figure 1:
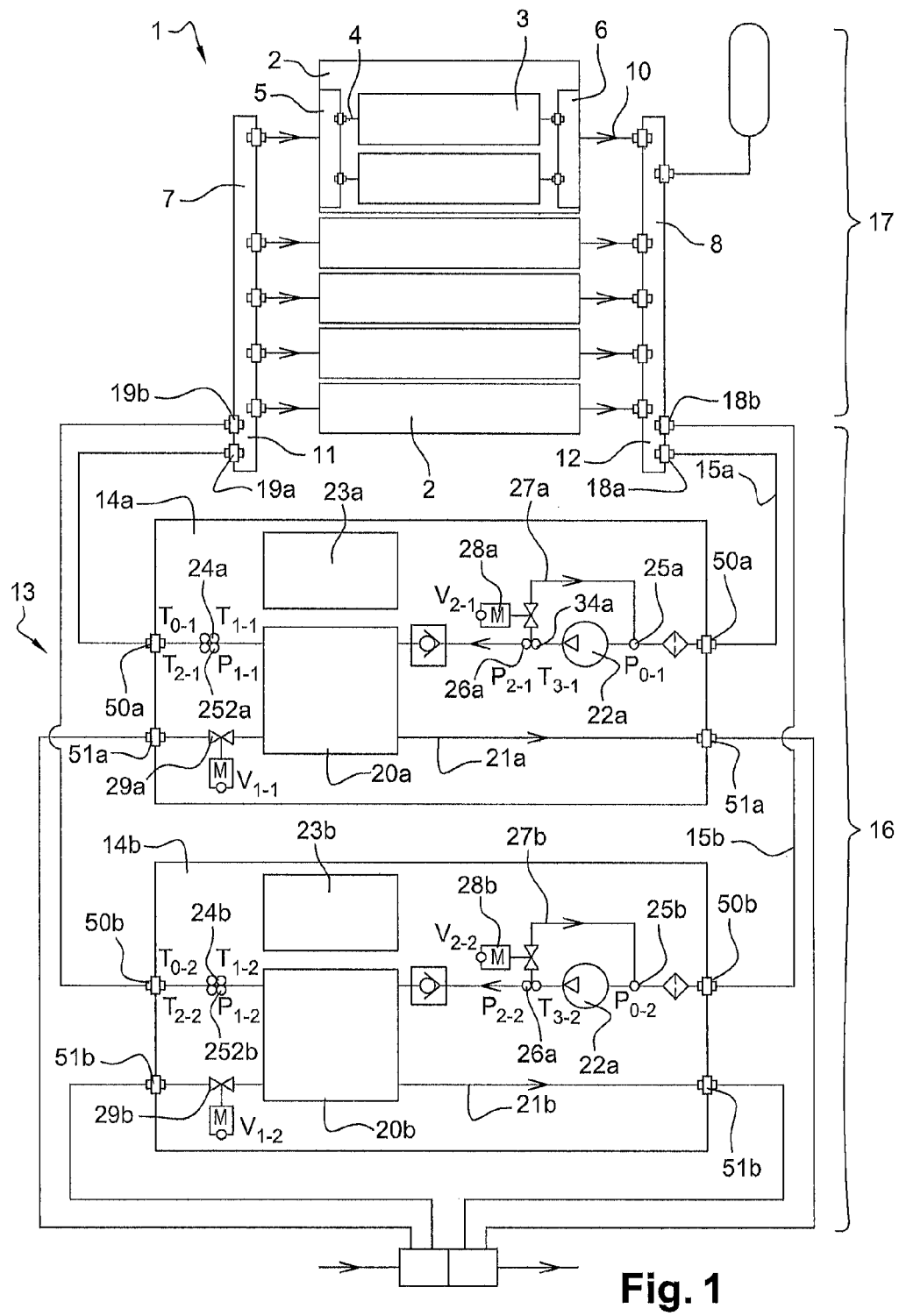
FIG. 1 shows a diagrammatic view of a computer cabinet according to an embodiment of the invention.

FIG. 1 shows a computer cabinet 1 according to an embodiment of the invention. This computer cabinet 1 comprises a rack inside which rackable servers 2 are inserted. In this embodiment, the computer cabinet 1 comprises five rackable servers 2. The first rackable server is shown in detail in FIG. 1, and the other rackable servers are identical to it. Each rackable server 2 comprises computer blades 3. Each computer blade 3 comprises an electronic board on which electronic components are mounted, particularly processors or memory modules. Each computer blade 3 comprises a liquid cooling device or cooler 4 that cool the electronic board and the electronic components. To achieve this, each liquid cooling device comprises a channel through which a coolant passes. Each liquid cooling device 4 may comprise a cold plate arranged parallel to the electronic board of the cold plate so as to cool it and to cool its electronic components. Each rackable server 2 also comprises an inlet manifold 5 connected to the device 4 for cooling computer blades 3 of the rackable server so as to distribute the coolant between these different cooling devices 4. The rackable server 2 also comprises an outlet manifold 6 connected to the cooling device 4 of the computer blades 3 of the rackable server so as to collect the coolant fluid from the different cooling devices of the computer blades 3 of the rackable server.

The computer cabinet 1 also comprises an inlet distribution manifold 7 connected to each of the inlet manifolds 5 of each rackable server 2 so as to distribute coolant between the different inlet manifolds 5 of the rackable servers 2. The computer cabinet 1 also comprises an outlet distribution manifold 8 connected to each of the outlet manifolds 6 of each rackable server 2 so as to collect the coolant between the different outlet manifolds 6 of the rackable servers 2.

The cooling device 4 of the computer blades 3 of the rackable servers 2, the inlet manifold 5 and outlet manifold 6 and the inlet and outlet distribution manifolds 7 form a cooling circuit 10 that cools the electronic components of the computer blades 3. This cooling circuit 10 comprises an inlet 11 in this case formed by the inlet distribution manifold 7 and an outlet 12 in this case formed by the outlet distribution manifold 8.

The computer cabinet 1 also comprises a coolant supply device 13 configured to supply the cooling circuit with coolant. The supply device 13 is located in a lower part 16 of the computer cabinet, while the rackable servers 2 are located in an upper part of the computer cabinet. Thus, coolant will not run on the rackable servers by gravity if there is a coolant leak.

The supply device 13 comprises two cooling modules 14a and 14b. The two cooling modules 14a and 14b are connected in parallel to the cooling circuit 10.

The two cooling modules 14a and 14b are identical.

Each cooling module 14a, 14b comprises a secondary hydraulic circuit 15a, 15b that can contain coolant. The secondary hydraulic circuit 15a, 15b comprises an inlet 18a, 18b connected to the outlet 12 from the cooling circuit 10 and an outlet 19a, 19b connected to the inlet 11 to the cooling circuit 10.

The inlet 18a, 18b to each secondary hydraulic circuit 15a, 15b is connected to the outlet 12 from the cooling circuit by flat-faced non-drip quick couplings 50a, 50b.

Similarly, the outlet 19a, 19b from each secondary hydraulic circuit 15a, 15b is connected to the inlet 11 to the cooling circuit through flat-faced non-drip quick couplings 50a, 50b.

Each cooling module 14a, 14b also comprises a heat exchanger 20a, 20b that can cool the coolant in the secondary hydraulic circuit 15a, 15b. To achieve this, the heat exchanger 20a, 20b is a plate exchanger through which the secondary hydraulic circuit 15a, 15b and a primary circuit 21a, 21b pass and which is connected to the client network in which a coolant circulates.

The primary circuit 21a, 21b of each cooling module is connected to the client network through flat-faced non-drip quick couplings 51a, 51b.

The coolant that circulates in the pipe 21a, 21b may be water. The coolant that circulates in the primary circuit 21a, 21b circulates in the opposite direction to the coolant that circulates in the secondary hydraulic circuit 15a, 15b. The flow of coolant that circulates in the primary circuit 21a, 21b is controlled by a valve 29a, 29b, itself controlled by the controller 23a, 23b of each cooling module.

Each cooling module 14a, 14b also comprises a pump 22a, 22a that circulates coolant inside the secondary hydraulic circuit and therefore inside the cooling circuit to which it is connected. In an embodiment, the pump has sufficient power to circulate the coolant at a differential pressure of about 3 bars at a flow of 75 l/min.

Each cooling module 14a, 14b also comprises control modules or controller 23a, 23b capable particularly of controlling the pump.

Each control module 14a, 14b also comprises temperature measurement device or sensor 24a for measuring the temperature of the coolant in the secondary hydraulic circuit. These temperature measurement device 24a may comprise three temperature sensors placed at the outlet from the secondary hydraulic circuit so as to make three temperature measurements $T_{0-1}$, $T_{1-1}$, $T_{2-1}$, and $T_{0-2}$, $T_{1-2}$, $T_{2-2}$ respectively, of the coolant at the outlet from the secondary hydraulic circuit. The temperature measurement device 24a for measuring the temperature of the coolant at the outlet from the secondary hydraulic circuit are connected to the controller 23a, 23b of the cooling module of which they form part. The fact that the coolant temperature is measured at the outlet from the secondary hydraulic circuit makes it possible to control the fluid flow circulating in the primary circuit 21a, 21b through the exchanger 20a, 20b by controlling the valve 29a, 29b, such that the temperature of the coolant at the outlet from the secondary hydraulic circuit is constant and equal to a threshold value. The coolant flow in the secondary cooling circuit is controlled such that the temperature of the coolant is constant between 16° C. and 40° C. The fact that there are three temperature sensors makes it possible to make redundant temperature measurements and therefore to make these measurements very reliable. It is thus very easy to detect if one of the sensors is not functioning.

Each cooling module 14a, 14b comprises at least one first pressure sensor 25a, 25b, the controller 23a, 23b of each cooling module 14a, 14b being connected to the first two pressure sensors 25a, 25b of each of the two cooling modules 14a, 14b. The first pressure sensor 25a, 25b of each cooling module is located at the inlet to the pump of said cooling module.

Each cooling module 14a, 14b comprises at least one second pressure sensor 252a, 252b located at the outlet from said cooling module, the difference between the measurement of the pressure sensor 252a, 252b and the measurement of the pressure sensor 25a, 25b being connected to the controller of the cooling module, in other words, the controller of the cooling module has a regulation program that processes the value of the "pressure difference between the outlet and the inlet of said cooling module", as it was measured by the two module inlet and outlet sensors, rather than processing the measurements from each of these two sensors separately and individually.

Each cooling module 14a, 14b also comprises a third pressure sensor ($P_{2-1}$) 26a, 26b at the outlet from the pump of the cooling module. This third pressure sensor 26a, 26b is used to verify that the pump is operating correctly in the case of an active module, and checks the pressure measurement in the case of an inactive module by comparing this pressure with the pressure $P_{0-2}$ of the other active module.

Furthermore, the measurement device of the pressure at the outlet from the pump 26a, 26b are connected to the controller 23a, 23b of the cooling module of which they form part.

The coolant flow in the secondary hydraulic circuit of each cooling module is controlled by controller 23a, 23b of the cooling module such that the flow through each computer blade 3 is constant. To achieve this, the controller controls the control valve 28a, 28b of the bypass such that the pressure difference between the outlet and the inlet of the cooling module is constant and equal to a threshold value.

Furthermore, in an embodiment, the coolant in the secondary hydraulic circuit and in the cooling circuit is under a sufficiently high static pressure to protect the pump against any risk of cavitation. This static pressure may be greater than or equal to 2 bars, for example equal to 2.5 bars.

Each cooling module 14a, 14b also comprises a bypass channel 27a, 27b located at the terminals of the pump 22a, 22b and that forces some coolant to bypass the pump. The quantity of coolant that is diverted in the bypass channel 27a, 27b is dosed by a control valve 28a, 28b controlled by the controllers.

The computer cabinet also comprises a central control unit connected to the controllers 23a, 23b of the two cooling modules.

Figure 2:
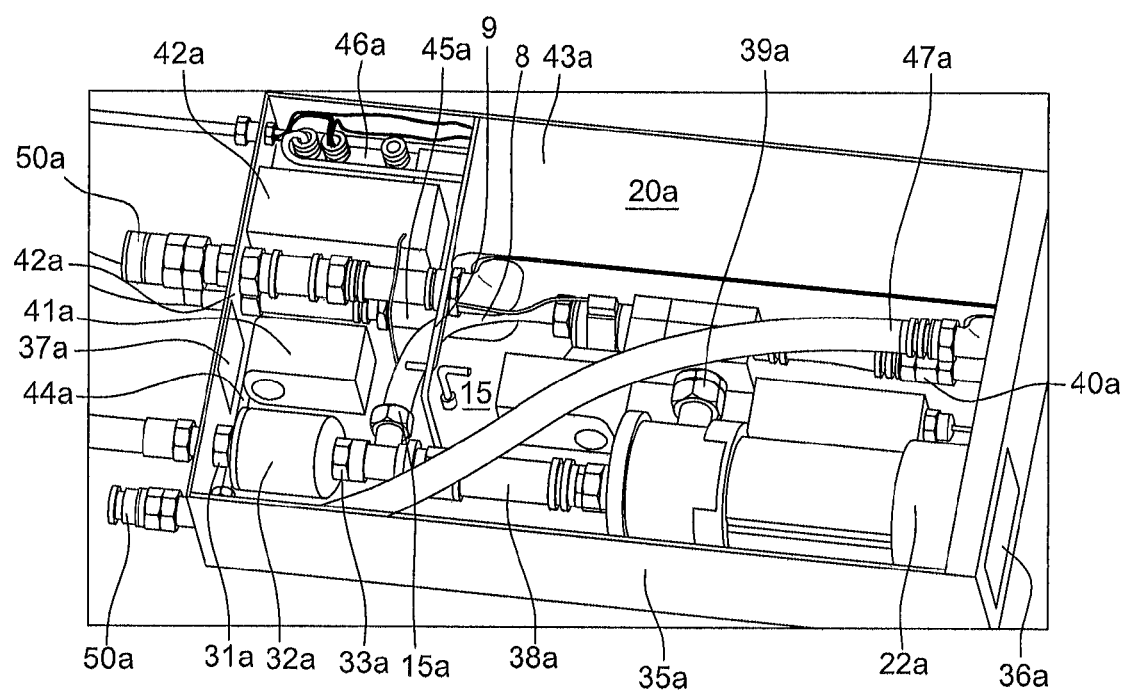
FIG. 2 shows a perspective view of a cooling module according to an embodiment of the invention.

A cooling module 14a is also shown more precisely in FIGS. 2 and 3. The other cooling module 14b is identical to the module shown.

The hydraulic circuit 15a of the cooling module 14a comprises an upstream pipe 31a in line with the axis of the pump 22a, which enables the regular fluid flow in the hydraulic circuit. More generally, the cooling module outputs the coolant at constant linear fluid velocities without any pressure variations that generate pressure losses and vibrations due to the shape of the pipes in the hydraulic circuit.

The cooling module 14a also comprises a filter 32a in line with the upstream pipe to minimise the pressure loss. This filter may be a 250 micron filter located upstream from the pump 15a to protect it, in line with the axis of the pump to obtain a regular flow protecting it against any risk of cavitation.

The cooling module 14a also comprises a compact tee 33a at the outlet from the bypass channel to mix the coolant from the by-pass channel 27a with the main coolant flow. There is no large cross-section change in this compact tee or five-channel connector. The pressure sensor 26a that measures the pressure at the pump outlet is installed as a branch connection perpendicular to the flow and without protrusion in the pipe to minimise the measurement error. The mix between coolant from the by-pass channel 27a and the main coolant flow is improved because the cross-sections of the three pipes are equal. An additional temperature sensor 34a measures the coolant temperature at the outlet from pump $T_{3-1}$, and thus adds an additional controller, particularly as temperature protection for the pump in the case of accidental circulation exclusively through the bypass channel.

A front grill 36a and two back grills 37a are formed in a stiffener 35a of the cooling module to allow air to circulate through the cooling module.

The pump 22a is located adjacent to the front grill 36a, its fan drawing cool air in from the outside through a grill with an air guide to prevent hot air that has already passed through the cooling module from being drawn back in preventing recirculation of hot air.

Furthermore, the axis of the pump 22a is in line with the upstream pipe 31a to enable uniform inlet to pump 22a.

A hose 38a is used to connect the pump 22a to the hydraulic circuit, which compensates for any alignment faults and enables the pump to be disassembled for maintenance.

The cooling module 22a also comprises a drilled block 39a on the downstream side of pump 22a:
no excessive cross-section change in the block,
pressure sensor installed perpendicular to the flow to minimise the measurement error,
separation into 2 flows without any disturbance because the cross-sections of the three pipes are equal.

The cooling module 14a comprises bends at the exchanger outlet and inlet to minimise overall dimensions.

The cooling module also comprises a large radius bend to minimise the pressure loss and not disturb the flow in the bypass.

The cooling module 14a also comprises a non-return valve 40a close to the exchanger to create a removable block and such that the flow from the other hydraulic module does not enter into this hydraulic module when the pump is stopped.

The cooling module 14a also comprises plane-faced non-drip quick couplings 50a so that one of the cooling modules can easily be disassembled in the case of failure or for maintenance, without needing to stop cooling the computer cabinet. When maintenance is being done, disassembly of the cooling module 14a is facilitated by a fast hydraulic disconnection system, both at the connection of the cabinet 17 to the hydraulic network and at its connection to the client water network. This modularity is possible due to plane-faced non-drip quick couplings. Thus, each cooling module is fitted with two pairs of quick couplings 50a, 51a (one pair 50a being provided at the inlet and the outlet connected to the cooling circuit of the cabinet and one pair 51a corresponding to the inlet and the outlet connected to the client hydraulic network). The two quick couplings connected to the cooling circuit of the cabinet 17 are located at the end of each of the inlet/outlet hoses 15a, and are coupled to the additional quick couplings located at the inlet 19a to the inlet distribution manifold 7 and at the outlet 18a from the outlet distribution manifold 8. The two quick couplings connected to the client hydraulic network are located directly on the facade of the cooling module.

The cooling module comprises proportional ball valves 41a, comprising a device to adjust the passage cross-section so as to improve linearity of the flow response as a function of the opening angle, with a servomotor installed horizontally to minimise the overall dimensions, with an electrical control to allow precise opening and precise reading of the opening, unlike a proportional solenoid valve.

Crossings through partition 42a of the hydraulic circuit and cooling pipe crossings through partitions of stiffener 35a are compact with no change of cross-section to minimise pressure losses.

The sum of the opening area of the two grills 37a on the back face of the module is similar to the area of the grill on the front face 36a: one of the grills on the back face is downstream from the temperature control valve and the other is downstream from the electronic control board.

The controller 23a comprises a central electronic control board 42a, placed in a sliding housing in the cooling module so that it can be disassembled for maintenance, cooled by the air flow created by the fan of pump 22a, with low DC voltages, protected from any splashes when accidental pipe leaks occur.

Furthermore, the cooling module is provided with sufficient space between components of the module to facilitate the passage of cooling air between the front and back grills, this flow being created by the pump fan.

The compact cross-flow plate exchanger 20a is made of copper to improve heat exchange performances, and is installed horizontally on its side to minimise the overall dimensions.

Furthermore, the heat exchanger is isolated, as are the pipes in the primary hydraulic circuit 15a connected to the client hydraulic network to enable the use of cold water at a temperature less than the dew point in the room, which prevents the need for a condensation monitoring system.

The cooling module also comprises a leak detector 44a installed close to the evacuation pipe. The back of the cooling module stiffener is leak tight and can retain a large quantity of liquid in the case of a leak; consequently, the leak will not be detected unless it is large, small leaks are deliberately ignored.

The power supply device to the pump 46a is enclosed in a sealed box for high pump electrical power supply AC voltages, containing the pump relay.

The cooling modules are controlled by the control unit such that only one cooling module is active while the other cooling module is passive. The active cooling module is connected to the cooling circuit such that the secondary hydraulic circuit of this cooling module is connected to the cabinet cooling circuit. Thus, the active cooling module controls the pressure difference between the cooling module outlet and inlet, at a threshold differential pressure such that consequently, the coolant flow through each computer blade in the cabinet cooling circuit is constant regardless of the number of servers being cooled.

If the active cooling module fails or when maintenance is being performed, the control unit activates the other cooling module such that it becomes active. The cooling module to be repaired can thus be removed without needing to stop cooling of the computer cabinet. The changeover of the active cooling module can also be programmed to check that the cooling module is available.

Thus, the cabinet always comprises at least one active cooling module that circulates coolant in the internal cooling circuit.

The invention claimed is:

1. A computer cabinet comprising:
    at least one rackable server through which a cooling circuit passes, the cooling circuit carrying a coolant, the cooling circuit comprising an inlet and an outlet;
    a coolant supply device configured to supply the cooling circuit with coolant, the supply device comprising:
        two cooling modules, each cooling module comprising:
            a primary hydraulic circuit a comprising an outlet for connection to the inlet of a client hydraulic network and an inlet for connection to the outlet of the client hydraulic network;
            a secondary hydraulic circuit comprising an outlet connected to the inlet of the computer cabinet cooling circuit and an inlet connected to the outlet of the computer cabinet cooling circuit;
            a heat exchanger to cool the coolant passing through the secondary hydraulic circuit by heat dissipation through the primary hydraulic circuit;
            a pump to control the coolant flow in the secondary hydraulic circuit;
            a controller configured to control the pump;
        a central control unit connected to the controller of each of the cooling modules;
        wherein the central control unit is configured to activate one of the cooling modules while the other cooling module is inactive, the secondary hydraulic circuit of the active cooling module supplying the cooling circuit so as to keep the coolant at a constant differential pressure between the cooling module outlet and inlet.

2. The computer cabinet according to claim 1, wherein the secondary hydraulic circuits of the cooling modules are connected in parallel.

3. The computer cabinet according to claim 1, wherein the two cooling modules are located in a lower part of the cabinet, the rackable server being located in an upper part.

4. The computer cabinet according to claim 1, wherein the static pressure of the coolant in the cooling circuit is greater than or equal to 2 bars.

5. The computer cabinet according to claim 1, wherein each cooling module also comprises at least one temperature sensor capable of measuring the temperature at the outlet from the secondary hydraulic circuit of said cooling module, the coolant flow in the primary hydraulic circuit being maintained at a flow selected such that the temperature at the outlet from the secondary hydraulic circuit is equal to a threshold temperature.

6. The computer cabinet according to claim 1, wherein each cooling module further comprises a bypass channel arranged to allow at least part of the coolant to bypass the pump.

7. The computer cabinet according to claim 1, wherein the secondary hydraulic circuit of each cooling module comprises a non-return valve on the upstream side of the exchanger.

8. The computer cabinet according to claim 1, wherein each cooling module comprises at least one first pressure sensor, the controller of each cooling module being connected to the first two pressure sensors of each of the two cooling modules.

9. The computer cabinet according to claim 1, wherein the first pressure sensor in each cooling module is located at the inlet to the pump of the cooling module.

10. The computer cabinet according to claim 1, wherein each cooling module comprises at least one third pressure sensor located at the outlet from the pump of said cooling module.

11. The computer cabinet according to claim 1, wherein the inlet and the outlet of the primary hydraulic circuit of each cooling module are fitted with non-drip quick couplings to facilitate connection and disconnection the primary hydraulic circuit to and from the client hydraulic network, the inlet and the outlet of the secondary hydraulic circuit of each cooling module being fitted with non-drip quick couplings that is usable to connect and disconnect the secondary hydraulic circuit to and from the cooling circuit.

12. The computer cabinet according to claim 1, wherein a fluid flowing in the primary hydraulic circuit circulates in an opposite direction to the coolant that circulates in the secondary hydraulic circuit.

13. The computer cabinet according to claim 1, wherein a fluid flowing in the primary hydraulic circuit circulates in the primary hydraulic circuit without passing in the cooling circuit.

14. A computer cabinet comprising:
    a plurality of rackable servers through each of which a separate cooling circuit passes, the cooling circuit carrying a coolant, each cooling circuit of the plurality of rackable servers including an inlet manifold and an outlet manifold;
    a coolant supply device arranged underneath the plurality of rackable servers and configured to supply the cooling circuit of each of the plurality of rackable servers with coolant, the coolant supply device comprising:
        two cooling modules arranged in parallel, each cooling module comprising:
            a primary hydraulic circuit comprising an outlet for connection to the inlet of a client hydraulic network and an inlet for connection to the outlet of the client hydraulic network;
            a secondary hydraulic circuit comprising an outlet connected to the inlet manifold of the cooling circuit of each of the plurality of rackable servers and an inlet connected to the outlet manifold of the cooling circuit of each of the plurality of rackable servers;
            a heat exchanger to cool the coolant passing through the secondary hydraulic circuit by heat dissipation through the primary hydraulic circuit;

a pump capable to control the coolant flow in the secondary hydraulic circuit;

a controller configured to control the pump;

a central control unit connected to the controller of each of the cooling modules;

wherein the central control unit is configured to activate one of the cooling modules while the other cooling module is inactive, the secondary hydraulic circuit of the active cooling module supplying the cooling circuit of each of the plurality of rackable servers so as to keep the coolant at a constant differential pressure between the cooling module outlet and inlet and so that the coolant flow through the cooling circuit of each of the plurality of rackable servers is constant.

15. The computer cabinet according to claim 14, wherein the outlet of the secondary hydraulic circuit is connected to the inlet manifold of the cooling circuit of each of the plurality of rackable servers via an inlet distribution manifold and wherein the inlet of the secondary hydraulic circuit is connected to the outlet manifold of the cooling circuit of each of the plurality of rackable servers via an outlet distribution manifold.

16. The computer cabinet according to claim 14, wherein a fluid flowing in the primary hydraulic circuit circulates in an opposite direction to the coolant that circulates in the secondary hydraulic circuit.

17. The computer cabinet according to claim 14, wherein a fluid flowing in the primary hydraulic circuit circulates in the primary hydraulic circuit without passing in the cooling circuit of each of the plurality of rackable servers.

18. The computer cabinet according to claim 14, wherein the static pressure of the coolant in the cooling circuit of each of the plurality of rackable servers is greater than or equal to 2 bars.

19. The computer cabinet according to claim 14, wherein each cooling module comprises at least one temperature sensor capable of measuring the temperature at the outlet from the secondary hydraulic circuit of said cooling module, the coolant flow in the primary hydraulic circuit being maintained at a flow selected such that the temperature at the outlet from the secondary hydraulic circuit is equal to a threshold temperature.

20. The computer cabinet according to claim 14, wherein the secondary hydraulic circuit of each cooling module comprises a non-return valve on the upstream side of the exchanger.

* * * * *